March 9, 1965 C. SCHARF ETAL 3,173,107

TEMPERATURE AND VOLTAGE COMPENSATED RELAXATION OSCILLATOR

Filed April 28, 1961

INVENTORS
CARROLL SCHARF
THEODOR F. STURM
BY
ATTORNEY

United States Patent Office
3,173,107
Patented Mar. 9, 1965

3,173,107

TEMPERATURE AND VOLTAGE COMPENSATED RELAXATION OSCILLATOR

Carroll Scharf, Ventura, and Theodor F. Sturm, Altadena, Calif., assignors to United Electrodynamics, Inc., Pasadena, Calif., a corporation of California Filed Apr. 28, 1961, Ser. No. 106,301
7 Claims. (Cl. 331—111)

Figure 1:
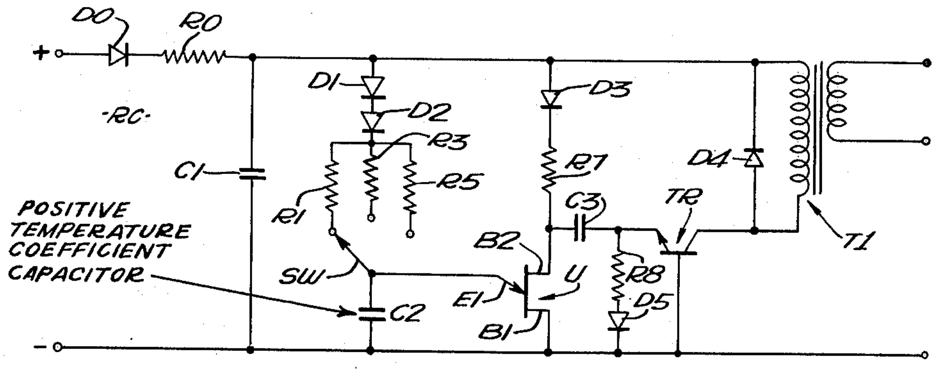

This invention relates to pulse generators and more particularly to unijunction transistor circuitry for generating trains of regularly recurring electrical pulses of short duration.

Many kinds of electronic switching devices employ sources of electrical pulses for periodically operating various switching elements therein. Pulse generators that are useful for the solution of various circuit problems have been previously described. A particularly useful pulse generating circuit that has been described uses a unijunction transistor. The use of such a transistor has many advantages. Typically, a single unijunction transistor can be used to make a relaxation oscillator circuit which otherwise normally requires the use of two conventional transistors. In addition, a relaxation oscillator using a unijunction transistor operates over a wide range of circuit parameters, voltages and ambient temperatures.

A typical relaxation oscillator circuit is described in the General Electric Transistor Manual, fifth edition, at page 141. Such a circuit suffers from some disadvantages. One disadvantage is that the circuit is relatively sensitive to electrical noise which may originate either in the input power source or in some other manner. Another disadvantage arises from the fact that in a unijunction transistor, the emitter diode forward resistance and the interbase resistance, that is the resistance measured between the two base terminals of the transistor with the emitter open circuited, varies with temperature. These changes of resistance with temperature are liable to result in a change of frequency of oscillation of the relaxation oscillator when the temperature changes.

The prior art does teach a means of compensating for temperature variation. Such compensation is accomplished by the selection of a particular value for a particular resistor used in the circuit of the prior art. However, the D.C. supply voltage may also vary. As will appear hereinafter, compensation for variations in supply voltage may also be accomplished by choice of an appropriate value for said particular resistor. Unfortunately, the optimum value of resistance for temperature compensation is not optimum for voltage compensation. Thus, either inadequate temperature compensation or inadequate voltage compensation results from the use of the compensation technique previously employed.

In a pulse generator employing the present invention, the pulse repetition rate may be accurately preset to a prescribed value and still exhibit a variation of less than 2% in frequency over a temperature range of from 0° C. to 125° C., under conditions which also include the possibility of D.C. supply voltage variation of ±15 percent. In addition, the present invention is highly insensitive to variation in impedance of the power supply.

The present invention comprises a relaxation oscillator which has been modified to operate at a pulse repetition rate that is stable over wide ranges of temperature or D.C. supply voltage or both. It also includes an input filter for the reduction of noise, which may be present in the D.C. voltage source and an output amplifier that improves the rise time of the output pulses and isolates the relaxation oscillator portion from the load circuit.

Figure 2:
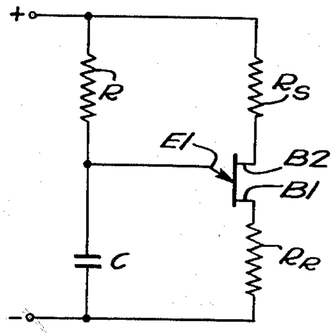
FIG. 2. PRIOR ART
Figure 3:
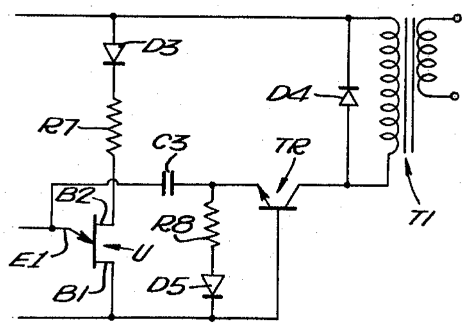
Figure 4:
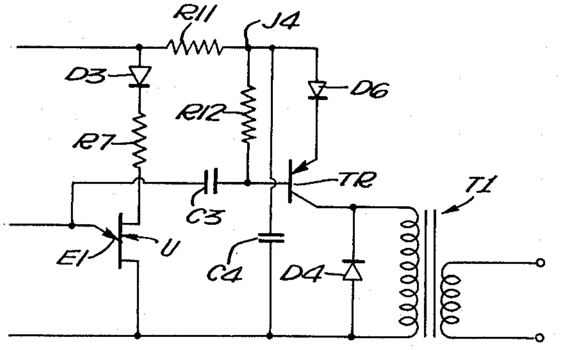

The foregoing and additional advantages of the present invention will become apparent from a study of the following specifications and drawings in which:

FIGURE 1 is a circuit diagram of pulse generator employing the present invention, FIGURE 2 is a relaxation oscillator circuit of the type taught by the prior art, FIGURE 3 is a fragmentary diagram of a modified form of the invention, and FIGURE 4 is a fragmentary diagram of another modified form of the invention.

For explanatory convenience, the circuit of FIG. 1 will be considered in three parts; namely, the main part of the oscillator, the input section, and the output section. The input filter section comprises a diode D0 connected to the positive terminal of the D.C. voltage supply such that a relatively low resistance is presented to the passage of electric current from the positive terminal through the remainder of the circuit to the negative terminal of the D.C. voltage supply when the power supply is properly connected. A resistor R0 is connected in series with diode D0 and a capacitor C1 is connected from the negative terminal of the D.C. voltage supply to the low voltage end of the resistor R0. The diode D0 is provided to protect the circuit against damage in case of a reversal of polarity of the input voltage source.

The RC filter formed by the resistor R0 and the capacitor C1 is provided to reduce noise emanating from the power source and to shunt the source at pulse frequencies so that changes in resistance of the source do not appreciably alter the frequency of oscillation, that is the pulse repetition rate. Such noise signals may originate within the power source itself or may arise by the action of other circuits connected to the source. The value chosen for the capacitor C1 offers a low impedance at the relatively high frequency components of the pulses produced by the present invention. Thus, portions of the circuit connected to opposite sides of the capacitor C1 are substantially at the same electrical voltage with regard to pulse signals. This relatively low impedance renders negligible any changes in the impedance of the power source and such changes in its impedance will not affect the pulse repetition rate of the relaxation oscillator portion of the present invention. In addition to its function in the filter described above, the resistor R0 also tends to isolate the supply voltage source from the capacitor C1 and the remainder of the oscillator.

The relaxation oscillator portion of the present invention comprises a unijunction transistor U having an emitter terminal E1 and a pair of base terminals B1 and B2. The emitter terminal E1 is connected to frequency selector circuit formed as described below. A pair of diodes D1 and D2 are connected in series with each other and with the resistor R0 at the junction of the resistor R0 and the capacitor C1. In series with the diodes D1 and D2 is a parallel combination of resistors that are employed to set the pulse repetition rate of the oscillator. This combination is formed by the resistor R1, forming one arm of the parallel combination, resistor R3, forming a second arm of the parallel combination and resistor R5 forming a third arm of the parallel combination.

One terminal of each of the three arms of the parallel combination is connected to the diode D2. The remaining terminals of the arms of the parallel combination of resistors, are respectively connected to one of three terminals of a three-position single-pole switch SW. The movable arm of the switch SW is connected to the emitter terminal E1 of the unijunction U and to a capacitor C2 which is connected to the negative terminal of the D.C.

voltage supply. The lower base terminal B1 of the unijunction transistor U is also connected directly to the negative terminal of the D.C. voltage supply. The upper base terminal B2 of the unijunction transistor U is connected to the junction of the resistor R0 and the capacitor C1 through a series combination comprising a resistor R7 and a diode D3.

The operation of the relaxation oscillator portion of the present invention may best be understood by reference to FIG. 2 which shows a common relaxation oscillator circuit employing a unijunction transistor.

Assume an operating cycle commencing at a time when the capacitor C is discharged. At this time, the emitter of the unijunction transistor is reverse biased and hence is nonconducting. As the capacitor C is charged through the resistor R, the emitter voltage $E_{1T}$ rises towards the supply voltage. When the emitter voltage $E_1$ reaches a value known as the peak point, or firing voltage, the emitter becomes forward biased and the dynamic resistance between the emitter and base B1 drops to a relatively low value. This phenomena is due to the fact that once the unijunction transistor is fired, the unijunction transistor exhibits a negative resistance characteristic at values of voltage below the peak point voltage. That is, an increased emitter current tends to reduce the resistance between the emitter and base terminal B1 and thus, once initiated, current that flows through the emitter and terminal B1 tends to increase. Thus, the capacitor C discharges rapidly through the emitter. With increased current flow through the emitter the emitter voltage decreases until the emitter ceases to conduct. Conduction ceases at a voltage on the capacitor C that corresponds to the valley point of the unijunction transistor.

When conduction through the emitter ceases the unijunction transistor is cut off and the cycle is repeated, that is, the emitter voltage $V_E$ tends to increase at the charge rate of the capacitor C until the emitter voltage $V_E$ again reaches the peak point voltage. At this point, the capacitor C discharges again and the entire cycle continues.

One of the principal problems encountered in the design of a relaxation oscillator circuit arises because of the requirement that the frequency of oscillation be extremely stable. Two principal factors contribute to instability in such a relaxation oscillator circuit. The first factor is that the effective peak point firing voltage and the valley point vary with temperature. This is due in part to the variation of the emitter diode voltage with temperature, and in part to the variation of the valley point with temperature, and in part to the variation of the resistance of the transistor with temperature. While it is well known that compensation for the temperature effect may be achieved by the use of a small resistor $R_S$ in series with upper terminal base B2, another problem arises from the fact that the supply voltage may also vary over a relatively wide range. A change in supply voltage can also cause changes in the interbase resistance of the transistor and in the valley point. It is also well known that a small resistor $R_S$ in series with upper base terminal B2 may also be used to compensate changes in frequency due to changes in voltage.

A further difficulty arises because of the fact that the optimum value for the series resistor is not the same for temperature compensation and for supply voltage compensation. The value of series resistance required for optimum temperature compensation is larger than the value of resistance required for optimum voltage compensation. The present invention provides a circuit that simultaneously compensates for both temperature and voltage variations.

In order to appreciate the present invention, it is necessary to understand both the effect of temperature variations upon the frequency of the relaxation oscillator and the effect of supply voltage variations upon the frequency of the relaxation oscillator. Some of the effects of temperature variations can be seen from reference to the following equation:

$$V_T = \eta V_{BB} + V_D$$

in which $V_T$=the peak point or firing voltage of the unijunction transistor.

$\eta$= the intrinsic stand-off ratio of the unijunction transistor. For a unijunction transistor, $\eta$ is a constant, being relatively independent of temperature and voltage. In practice $\eta=0.6$ approximately.

$V_{BB}$=the instantaneous interbase voltage measured between base terminal B1 and terminal base B2.

The emitter diode voltage $V_D$ is found to decrease with temperature at a rate of approximately 3 mv./° C. As can be seen from reference to the equation given above, when the emitter diode voltage $V_D$ decreases, the peak point or firing voltage also decreases. A decrease in firing voltage implies that the unijunction transistor will fire sooner and that the frequency of the relaxation oscillator will correspondingly increase. Compensation for the effect of temperature upon the emitter diode voltage $V_D$ is based upon the fact that the interbase resistance, that is, the resistance $R_{BB}$, between base terminal B1 and base terminal B2 increases with temperature at approximately 0.8%/° C. Since the interbase BB resistance $R_{BB}$ increases with temperature, it is evident that the interbase voltage $V_{BB}$ also increases with temperature so long as the values of resistors $R_R$ and $R_S$ are constant. For this reason partial temperature compensation can be achieved through utilization of the temperature dependence of the interbase resistance $R_{BB}$. Since the interbase voltage $V_{BB}$ and interbase resistance $R_{BB}$ increases with temperature while the emitter diode voltage $V_D$ is decreasing, it is evident that when the proper proportioning of resistance is achieved, the increase in interbase resistance $R_{BB}$ can compensate for the decrease in emitter diode $V_D$. Thus, the addition of an appropriate resistor $R_S$ in series with base terminal B2 can properly adjust the proportionality so that temperature stability is achieved. Formulas for the calculation of the optimum value of such a series resistor are well known.

The effect of changes in supply voltage will next be considered. It is evident that when the voltage at the emitter E1 of a unijunction transistor is greater, by a particular amount, than the voltage at base terminal B1 of a unijunction transistor, the transistor will fire. In general, as indicated in FIG. 2, the resistor R and the capacitor C form one branch of a voltage divider, or bridge, the other branch of which is formed by the resistor $R_S$, the interbase resistance $R_{BB}$, and the resistor $R_R$, in series. With such a voltage divider, the voltage at the emitter does not increase proportionately with the voltage at base terminal B1, even though the same voltage is applied across both legs of the voltage divider. For this reason a change in power supply voltage effects the pulse repetition rate. Since the interbase resistance $R_{BB}$ increases with increased supply voltage when a constant resistance is in series with its base terminals B1 or B2 and since $\eta$ is constant, it is evident that an increase in supply voltage causes the firing potential to increase faster than the voltage across the capacitor C2 and results in a decreased frequency of the relaxation oscillator. As has been explained before in connection with temperature compensation, addition of a small resistor $R_S$ in series with the base terminal B2 of the unijunction transistor tends to decrease the frequency of the relaxation oscillator.

The difficulty encountered in relaxation oscillators using unijunction transistors, which have been described in the prior art, arises from the fact that the optimum value of the series resistance $R_S$ for temperature compensation is different from the optimum value for the series resistance $R_S$ for supply voltage variation compensation. According to the present invention, a diode is used in series with the series resistor $R_S$ and a pair of diodes in series with the resistor R in FIG. 2. Each of the added diodes exhibits a decrease in voltage drop with increased temperature. The magnitudes of these decreases are such that a high degree of compensation for both temperature and voltage changes are provided simultaneously.

Referring now to FIG. 1, the diode D3 is added in series with the resistor R7. The voltage drop across the resistor R7 and the diode D3 is chosen as optimum for temperature compensation. Since the value of series resistance R7 for optimum temperature compensation is larger than the optimum value of resistance for optimum voltage compensation, the diodes D1 and D2 are added in series with either R1, R3 or R5.

It has been found that the forward drop of the two diodes D1 and D2 is approximately correct to compensate for the effect of supply voltage deviations. The decrease in forward drop of the diodes D1 and D2 with temperature prevents any deterioration of the temperature compensation already provided.

The resistors R1, R3, R5, and R7 are wire wound resistors having very low, almost zero, temperature coefficients. The capacitor C2 chosen, is used because its positive temperature coefficient assists in compensating for the increase in frequency of the relaxation oscillator with increased temperature.

The combined effects of diodes D1, D2, and D3, resistor R7, and capacitor C2 are such that the relaxation oscillator maintains a repetition rate accurate to within one percent over a temperature range from approximately 0° C. to 125° C. and over a supply voltage range of approximately 20 volts to 30 volts.

Each time the unijunction transistor in the relaxation oscillator circuit fires, discharging the capacitor C2, a current pulse flows in the circuits connected to the base terminals B1 and B2. With the various circuit parameters a pulse duration of approximately 10 microseconds is obtained. However, any one of the three different intervals between pulses can be chosen by setting the movable arm of the switch SW to one of its three positions. In the first position of the switch SW, that is, with resistor R1 connected to the emitter, the interval between pulses is approximately 3.3 milliseconds. If resistor R3 is connected to the emitter, the interval between pulses becomes approximately 33 milliseconds. And if the resistor R5 is connected to the emitter, the interval between pulses becomes approximately 66 milliseconds. The discharge line of the capacitor C2 is increased by the direct connection of one end of the capacitor to the lower base terminal B1 that is by the elimination of the Resistor $R_R$.

The amplifier section of the pulse generator circuit serves a dual function. These functions are to reduce the rise time of the output pulses and to isolate the relaxation oscillator section from the load.

In a system that has been found satisfactory the diodes D1, D2, D3 of the oscillator have been of the type that bears the designation 1N625 while the unijunction transistor was the type that bears the number 2M492. The value of the resistance R7 was 430 ohms. The capacitor C2 was a Sprague vitamin Q capacitor having a capacitance of 0.068$\mu$f. and the resistance of the resistors R1, R3 and R5 were respectively 54 KΩ, 260 KΩ and 550 KΩ. The capacitance of the capacitor C2 increased 5% over the temperature range from 0° to 125° C. The action can also be improved somewhat by connecting a resistor of a few hundred to a thousand ohms in parallel across the two diodes D1 and D2.

All of the diodes were of the silicon type to provide a high degree of temperature stability over a wide temperature range.

Referring again to FIG. 1, the output of the relaxation oscillator section of the pulse generator circuit is obtained by making a connection to the base terminal B2 of the unijunction transistor U. The relaxation oscillator output is coupled to the emitter terminal of an npn transistor TR. The emiter terminal of the transistor TR is also connected to the negative side of the D.C. supply voltage through a resistor R8 and a diode D5, in series. The collector terminal of the transistor TR is connected to the positive side of the D.C. supply voltage source at the junction of the resistor R0 and the capacitor C1 through the primary winding of a transformer T1. A diode D4 is connected across the primary winding with its cathode on the plus side thereof. The secondary windings of the transformer T1 are connected to any desired load elements. The base terminal of the transistor TR is connected directly to the negative side of the supply voltage. The capacitor C3 functions as a coupling capacitor and also assists in decreasing the rise time of the output pulse. The diode D4 prevents the transformer from ringing. The series combination of the resistor R8 and the diode D5 provide the necessary bias for correct operation of the transistor TR so that no current should be drawn from the amplifying transistor at times other than during the generation of an output pulse.

The amplifier section which has been described above improves the rise time of the output pulse from approximately 2 volts per microsecond to approximately 10 volts per microsecond. The output transformer T1 may be any desired pulse transformer that responds with such rise times.

Although a connection has been described to the base terminal B2 of the unijunction transistor U, the emitter terminal of the transistor TR may instead be connected to the emiter terminal E1 of the unijunction transistor U as shown in FIG. 3. The advantage derived from this connection is that with it larger voltage pulses are present at the emitter terminal E1 of the unijunction transistor U.

In the circuit of FIG. 4 even faster rise time and larger output voltages are achieved. In this case the emitter El of the unijunction transistor U is connected through the coupling capacitor C3 to the base of the transistor TR. The base is also connected to the junction J4 between the resistor R0 and C1 through a potential divider that includes the resistors R11 and R12. A by-pass capacitor C4 is connected between the junction J4 and the negative side of the power supply. A clamping diode D6 is connected between the junction of the two resistors R11 and R12 and the emitter of the amplifier transistor TR. In this arrangement the primary winding of the output transformer is connected between the collector of the transistor TR and negative terminal of the power supply. In this case, the transistor TR is normally biased off but is turned on when a negative pulse is applied to its base from the emitter E1 of the unijunction transistor U.

Though the invention has been described with reference to only certain specific embodiments thereof, it will be understood that many variations may be made therein without departing from the principles of the invention. More particularly, it will be understood that other circuit elements may be employed than those described and furthermore that the values of the various circuit elements may be modified in many ways while utilizing the invention. It is therefore to be understood that the invention is not limited to the specific embodiments thereof that have been described but that the invention may be embodied in many other forms within the scope of the appended claims.

The invention claimed is:

1. An electrical pulse generator comprising:

a source of D.C. voltages having positive and negative terminals, a relaxation oscillator electrically coupled to said D.C. source for providing electrical pulses of a fixed duration at a fixed frequency, said relaxation oscillator including means for maintaining said frequency of said relaxation oscillator independent of ambient temperature changes and means for simultanously maintaining said frequency of said relaxation oscillator independent of changes in said D.C. voltage level, said relaxation oscillator comprising a unijunction transistor having an emitter terminal and first and second base terminals, said first base terminal being connected to said negative terminal, a frequency determining circuit, comprising a resistor and two series-connected diodes connected between said emitter and said positive terminal, and also comprising capacitor means connected between said emitter terminal and said negative terminal, an additional resistor and a third diode connected in in series in a circuit having one end connected to second base terminal and the other end connected to said positive terminal.

2. An electrical pulse generator for providing electrical pulses of a fixed duration at a fixed frequency, said pulse generator comprising a source of D.C. voltage have positive and negative terminals, a unijunction transistor having an emitter terminal and first and second base terminals, said first base terminal being connected to said negative terminal, a frequency determining circuit comprising, a frequency selector circuit connected between said emitter terminal and said positive terminal and capacitor means connected between said emitter terminal and said negative terminal, said selector circuit comprising a pair of series-connected diodes and a plurality of resistors selectively connectable in series with said diodes between said emitter terminal and said positive terminal, an additional resistor, and a third diode connected in a circuit having one end connected to said second base terminal and the other end connected to said positive terminal, and a load element electrically coupled to said second base terminal.

3. An electrical pulse generator for providing electrical pulses of a fixed duration at a fixed frequency, said pulse generator comprising a source of D.C. voltage having positive and negative terminals, a unijunction transistor having an emitter terminal and first and second base terminals, said first base terminal being connected to said negative terminal, a frequency determining circuit comprising, a frequency selector circuit connected between said emitter terminal and said positive terminal and capacitor means connected between said emitter terminal and said negative terminal, said selector circuit comprising a pair of series-connected diodes and a plurality of resistors selectively connectable in series with said diodes between said emitter terminal and said positive terminal, an additional resistor and a third diode connected in series in a circuit having one end connected to said second base terminal and the other end connected to said positive terminal, and a load element electrically coupled to said emitter terminal.

4. An electrical pulse generator for providing electrical pulses of a fixed duration at a fixed frequency, said pulse generator comprising a source of D.C. voltage having positive and negative terminals, a unijunction transistor having an emitter terminal and first and second base terminals, said first base terminal being connected to said negative terminal, a frequency determining circuit, comprising a resistor and two series-connected diodes connected between said emitter and said positive terminal, and also comprising capacitor means connected between said emitter terminal and said negative terminal, an additional resistor and a third diode connected in series in a circuit having one end connected to said second base terminal and the other end connected to said positive terminal, and a load element electrically coupled to said emitter terminal.

5. An electrical pulse generator comprising a source of D.C. voltage having positive and negative terminals, a relaxation oscillator electrically coupled to said D.C. source for providing electrical pulses of a fixed duration at a fixed frequency, said relaxation oscillator including means for maintaining said frequency of said relaxation oscillator independent of ambient temperature changes and means for simultaneously maintaining said frequency of said relaxation oscillator independent of changes in said D.C. voltage level, said relaxation oscillator comprising a unijunction transistor having an emitter and first and second base terminals, said first base terminal connected to said negative terminal, a frequency determining circuit comprising, a frequency selector circuit connected between said emitter terminal and said positive terminal and capacitor means connected between said emitter terminal and said negative terminal, said selector circuit comprising a pair of series-connected diodes and a plurality of resistors selectively connectable in series with said diodes between said emitter terminal and said positive terminal, An additional resistor and a third diode connected in series in a circuit having one end connected to said second base terminal and the other end connected to said positive terminal, and a load element electrically coupled to said second base terminal.

6. An electrical pulse generator comprising a source of D.C. voltage having positive and negative terminals, a relaxation oscillator electrically coupled to said D.C. source for providing electrical pulses of a fixed duration at a fixed frequency, said relaxation oscillator including means for maintaining said frequency of said relation oscillator independent of ambient temperature changes and means for simultaneously maintaining said frequency of said relaxation oscillator independent of changes in said D.C. voltage level, said relaxation oscillator comprising a unijunction transistor having an emitter terminal and first and second base terminals, said first base terminal connected to said negative terminal, a frequency determining circuit, comprising a resistor and two series-connected diodes connected between said emitter and said positive terminal, and also comprising capacitor means connected between said emitter terminal and said negative terminal, said capacitor means characterized by a positive temperature coefficient, and additional resistor and a third diode connected in series in a circuit having one end connected to said second base terminal and the other end connected to said positive terminal, a load element, and amplifying means electrically coupled to said relaxation oscillator and to said load element for decreasing the rise time of said electrical pulses and for electrically isolating said relaxation oscillator from said load element.

7. An electrical pulse generator comprising a source of D.C. voltage having positive and negative terminals, filter means electrically coupled to said source for maintaining said source at a relatively fixed D.C. level, a relaxation oscillator electrically coupled to said D.C. source for providing electrical pulses to a fixed duration at a fixed frequency, said relaxation oscillator including means for maintaining said frequency of said relaxation oscillator independent of ambient temperature changes and means for simultaneously maintaining said frequency of said relaxation oscillator independent of changes in said D.C. voltage level, said relaxation oscillator comprising a unijunction transistor having an emitter terminal and first and second base terminals, said first base terminal connected to said negative terminal, a frequency determining circuit comprising, a frequency selector circuit connected between said emitter terminal and said positive terminal and capacitor means connected between said emitter terminal and said negative terminal, said selector circuit comprising a pair of series-connected diodes and a plurality of resistors selectively connectable in series with said diodes between said emitter terminal and said positive terminal, said capacitor means having a positive temperature coefficient, an additional resistor and a third diode connected in series in a circuit having one end connected to said second base terminal and the other end connected to said positive terminal, a load element, and amplifying means electrically coupled to said relaxation oscillator and to said load element for decreasing the rise time of said electrical pulses and for electrically isolating said relaxation oscillator from said load element.

References Cited in the file of this patent

UNITED STATES PATENTS 2,810,073 Bradmiller ------------- Oct. 15, 1957